(12) United States Patent
Yan

(10) Patent No.: US 8,829,524 B2
(45) Date of Patent: Sep. 9, 2014

(54) THIN FILM TRANSISTOR ARRAY SUBSTRATE HAVING SANDWICH STRUCTURE GATE ELECTRODE AND MANUFACTURING METHOD THEREOF

(75) Inventor: Shuo-Ting Yan, Miao-Li (TW)

(73) Assignee: Innolux Corporation, Miao-Li County (TW)

(*) Notice: Subject to any disclaimer, the term of this patent is extended or adjusted under 35 U.S.C. 154(b) by 1866 days.

(21) Appl. No.: 11/906,522

(22) Filed: Oct. 1, 2007

(65) Prior Publication Data

US 2008/0096015 A1 Apr. 24, 2008

(30) Foreign Application Priority Data

Sep. 29, 2006 (TW) .............................. 95136316 A

(51) Int. Cl.
*H01L 27/14* (2006.01)
*H01L 27/12* (2006.01)
*H01L 21/44* (2006.01)

(52) U.S. Cl.
CPC ............ *H01L 27/1214* (2013.01); *H01L 27/12* (2013.01)
USPC ................ 257/72; 257/59; 257/153; 257/390; 257/E21.021; 257/E29.157; 438/587; 438/652; 438/653; 438/654

(58) Field of Classification Search
CPC .............. H01L 27/1214; H01L 29/744; H01L 27/14812; H01L 27/312; H01L 29/872
USPC .................. 257/E21.021, 751, 486, E21.061, 257/E29.157, 249, 153, 59, 72, 390, 750; 438/587, 652–654
See application file for complete search history.

(56) References Cited

U.S. PATENT DOCUMENTS

| 5,120,572 A * | 6/1992 | Kumar ............................ 216/16 |
| 6,291,876 B1 * | 9/2001 | Stumborg et al. ............. 257/632 |
| 6,433,429 B1 * | 8/2002 | Stamper ........................ 257/751 |
| 7,247,911 B2 | 7/2007 | Tsai et al. |
| 7,294,544 B1 * | 11/2007 | Ho et al. ........................ 438/250 |
| 2003/0232497 A1 * | 12/2003 | Xi et al. ........................ 438/627 |
| 2004/0185683 A1 * | 9/2004 | Nakamura ................... 438/957 |
| 2004/0253815 A1 * | 12/2004 | Sun et al. ...................... 438/670 |
| 2005/0082538 A1 * | 4/2005 | Kado et al. ...................... 257/72 |
| 2005/0142841 A1 * | 6/2005 | Lee ................................ 438/622 |

(Continued)

FOREIGN PATENT DOCUMENTS

CN 1447367 A 10/2003

OTHER PUBLICATIONS

Lane et al. Adhesion and reliability of copper interconnections with Ta and TaN barrier layers. Journal of Materials Research. vol. 15, No. 1, Jan. 2000, pp. 203-211.*

(Continued)

*Primary Examiner* — Lynne Gurley
*Assistant Examiner* — Galina Yushina
(74) *Attorney, Agent, or Firm* — WPAT, PC; Justin King

(57) ABSTRACT

An exemplary thin film transistor array substrate (200) includes a substrate (210) and a gate electrode (220) formed on the substrate. The gate electrode includes an adhesive layer (226) formed on the substrate, a conductive layer (224) formed on the adhesive layer and a barrier layer (222) formed on the conductive layer, the adhesive layer and the barrier layer both have sandwich structures. A central core of the adhesive layer, the conductive layer, and a central core of the barrier layer are made of a same material.

20 Claims, 3 Drawing Sheets

(56) References Cited

U.S. PATENT DOCUMENTS

| | | | |
|---|---|---|---|
| 2006/0019495 A1* | 1/2006 | Marcadal et al. | 438/683 |
| 2006/0138659 A1* | 6/2006 | Liu et al. | 257/751 |
| 2006/0197191 A1* | 9/2006 | Tsai et al. | 257/640 |
| 2006/0202203 A1* | 9/2006 | Chen et al. | 257/59 |
| 2006/0251800 A1* | 11/2006 | Weidman et al. | 427/99.5 |
| 2006/0289889 A1* | 12/2006 | Yamazaki et al. | 257/99 |
| 2007/0020910 A1* | 1/2007 | Park et al. | 438/612 |

OTHER PUBLICATIONS

Simka et al. Fundamentalos of Cu/Barrier-Layer Adhesion in Microelectronic Processing. Materials Reseraceh Society Symposium Proceedings, vol. 863, 2005, pp. B9.2.1-B9.2.6.*

Simka et al. Fundamental of Cu/Barrier-Layer Adhesion in Microelectronic Processing. Mater. Res. Soc. Proc., vol. 863, 2005, pp. B9.2.1-B9.2.6.*

* cited by examiner

THIN FILM TRANSISTOR ARRAY SUBSTRATE HAVING SANDWICH STRUCTURE GATE ELECTRODE AND MANUFACTURING METHOD THEREOF

CROSS-REFERENCE TO RELATED APPLICATION

This application is related to, and claims the benefit of, a foreign priority application filed in Taiwan as Serial No. 095136316 on Sep. 29, 2006. The related application is incorporated herein by reference.

FIELD OF THE INVENTION

The present invention relates to a thin film transistor array substrate typically used in liquid crystal displays, and particularly to a thin film transistor array substrate having a sandwich structure gate electrode, and a method of manufacturing the thin film transistor array substrate.

GENERAL BACKGROUND

A typical liquid crystal display (LCD) is capable of displaying a clear and sharp image through thousands or even millions of pixels that make up the complete image. The liquid crystal display has thus been applied to various electronic equipment in which messages or pictures need to be displayed, such as mobile phones and notebook computers. A liquid crystal panel is a major component of the LCD, and generally includes a thin film transistor (TFT) array substrate, a color filter substrate, and a liquid crystal layer sandwiched between the two substrates.

Referring to FIG. 6, part of a typical TFT array substrate 100 is shown. The TFT array substrate 100 includes a glass substrate 101, a gate electrode 102 formed on the substrate 101, a gate insulating layer 103 formed on the substrate 101 including the gate electrode 102, a semiconductor layer 104 formed on the gate insulating layer 103, a source electrode 105 and a drain electrode 106 formed on the gate insulating layer 103 and the semiconductor layer 104, a passivation layer 107 formed on the gate insulating layer 103, the source electrode 105 and the drain electrode 106, and a pixel electrode 108 formed on the passivation layer 107.

To decrease a resistance-capacitance (RC) delay time, the gate electrode 102 is generally made from copper (Cu) because copper has a low electrical resistivity. However, the TFT array substrate 100 having the copper gate electrode 102 frequently has two defects. First, an adhesion between the copper gate electrode 102 and the substrate 101 is not very strong. Therefore the gate electrode 102 is liable to peel off from the substrate 101. Second, the copper is easily ionized to copper ions by heat dissipating from the TFT. The copper ions may penetrate into the gate insulating layer 103, or even penetrate into the semiconductor layer 104. This copper ion migration contaminates the gate insulating layer 103 and the semiconductor layer 104, and deteriorates the performance of the TFT. For example, leakage current may occur or be increased.

Referring to FIG. 7 and FIG. 8, in order to overcome the defects described above, improved sandwich structure gate electrodes 112 and 113 have been developed. The sandwich gate electrode 112 includes an adhesive layer 118 formed on a substrate, a barrier layer 114 formed above the adhesive layer 118, and a gate electrode layer 116 sandwiched between the adhesive layer 118 and the barrier layer 114. The adhesive layer 118 can enhance the adhesion between the gate electrode layer 116 and the substrate. The barrier layer 114 can prevent copper ions from penetrating into an adjacent semiconductor layer. The three layers 118, 114, 116 are made from different materials. The sandwich gate electrode 113 has a similar sandwich structure as the gate electrode 112. However, the gate electrode 113 is made from materials different from those of the gate electrode 112.

In an etching process during manufacturing of the gate electrode layer 116, an etching speed varies according to the different materials of the three layers 118, 114, 116. This may lead to a trapezium structure of the gate electrode 112. When the etching speed of the gate electrode 112 decreases from the top barrier layer 114 to the bottom adhesive layer 118, a width of the gate electrode 112 increases from top to bottom, as shown in FIG. 7. If the etching is not complete, a short circuit is liable to be created or occur during operation of the TFT. On the other hand, when the etching speed of the gate electrode 113 increases from the top barrier layer 114 to the bottom adhesive layer 118, a width of the gate electrode 113 decreases from top to bottom, as shown in FIG. 8. During subsequent depositing processes, open circuits or poor quality covering are liable to occur.

What is needed, therefore, is a thin film transistor array substrate and manufacturing method thereof that can overcome the above-described deficiencies.

SUMMARY

In one preferred embodiment, a thin film transistor array substrate includes a substrate and a gate electrode formed on the substrate. The gate electrode includes an adhesive layer formed on the substrate, a conductive layer formed on the adhesive layer and a barrier layer formed on the conductive layer, both the adhesive layer and the barrier layer have sandwich structure. A central core of the adhesive layer, the conductive layer, and a central core of the barrier layer are made of a same material.

Other novel features and advantages will become more apparent from the following detailed description when taken in conjunction with the accompanying drawings. In the drawings, all the views are schematic.

DETAILED DESCRIPTION OF PREFERRED EMBODIMENTS

Figure 1:
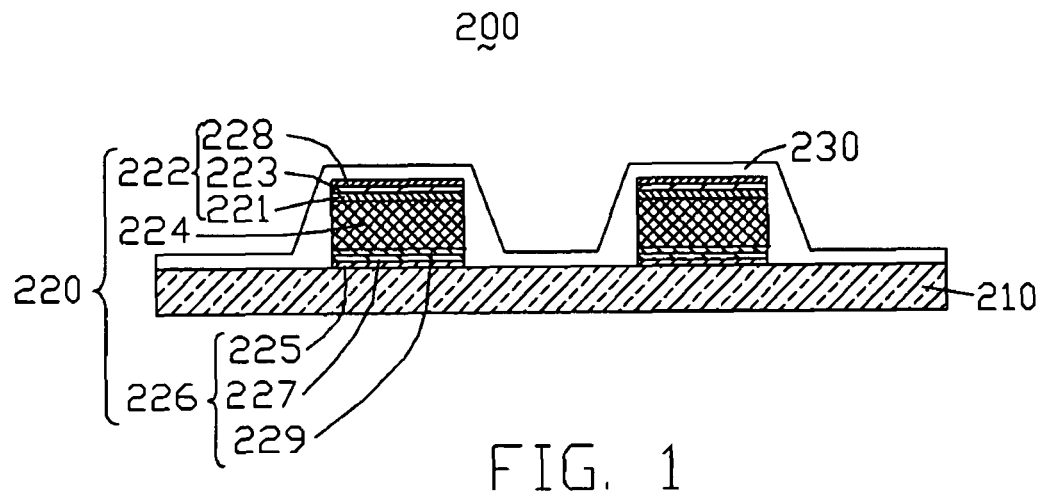
FIG. 1 is a side, cross-sectional view of part of a thin film transistor array substrate according to a first embodiment of the present invention.

Reference will now be made to the drawing figures to describe various embodiments of the present invention in detail.

Referring to FIG. 1, a thin film transistor array substrate 200 according to the present invention includes a transparent glass substrate 210, a plurality of gate electrodes 220 on the substrate 210, and an insulating layer 230 on the substrate 210 having the gate electrodes 220. In FIG. 1, two gate electrodes 220 are shown. In an alternative embodiment, the substrate 210 can be a transparent quartz substrate.

Each gate electrode 220 has a multi-layer structure, and includes an adhesive layer 226 formed on the substrate 210, a conductive layer 224 formed on the adhesive layer 226, and a barrier layer 222 formed on the conductive layer 224. The conductive layer 224 is made from copper, and has a thickness in the range from 200 to 400 nm (nanometers). The adhesive layer 226 has a sandwich structure, and has a total thickness in the range from 5 to 30 nanometers. The adhesive layer 226 includes a first adhesive metal layer 225, a second adhesive metal layer 229, and a first copper layer 227 sandwiched between the first adhesive metal layer 225 and the second adhesive metal layer 229. A material of the adhesive metal layers 225, 229 can be titanium (Ti), molybdenum (Mo), chromium (Cr), tungsten (W), or an alloy of copper and molybdenum. The barrier layer 222 has a sandwich structure, and has a total thickness in the range from 5 to 30 nanometers. The barrier layer 222 includes a first barrier metal layer 221, a second barrier metal layer 228, and a second copper layer 223 sandwiched between the first barrier metal layer 221 and the second barrier metal layer 228. A material of the barrier metal layers 221, 228 can be titanium nitride (TiN) or tantalum nitride (TaN). The thickness of the barrier layer 222 can be equal to that of the adhesive layer 226.

Figure 2:
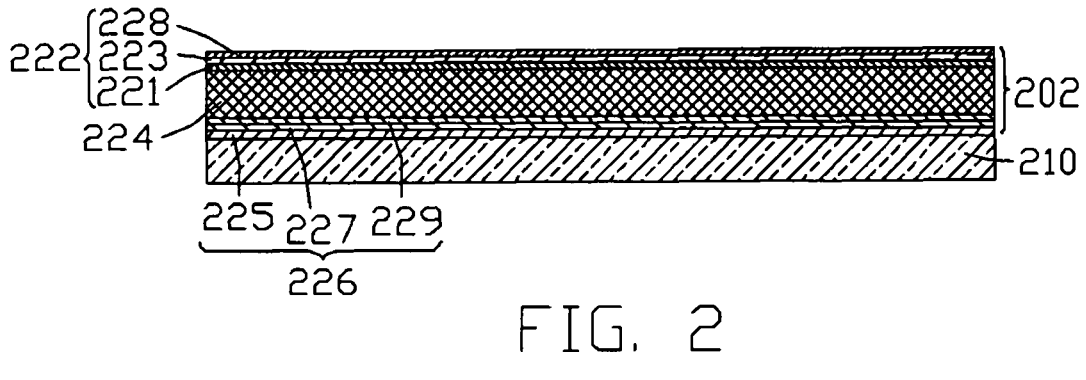
FIGS. 2-5 are side, cross-sectional views showing sequential steps of forming the thin film transistor array substrate of FIG. 1.

An exemplary method of manufacturing the thin film transistor array substrate 200 is described in detail as follows:

Referring to FIG. 2, a substrate 210 is provided. The substrate 210 can be made from glass or quartz. A first adhesive metal layer 225, a first copper layer 227, a second adhesive metal layer 229, a conductive layer 224, a first barrier metal layer 221, a second copper layer 223, a second barrier metal layer 228, and a photo-resist layer (not shown) are deposited on the glass substrate 210, in that order from bottom to top. The first adhesive metal layer 225, the first copper layer 227, and the second adhesive metal layer 229 cooperatively define an adhesive layer 226. The first barrier metal layer 221, the second copper layer 223, and the second barrier metal layer 228 cooperatively define a barrier layer 222. The adhesive layer 226, the barrier layer 222, and the conductive layer 224 cooperatively define a gate electrode layer 202.

Figure 3:
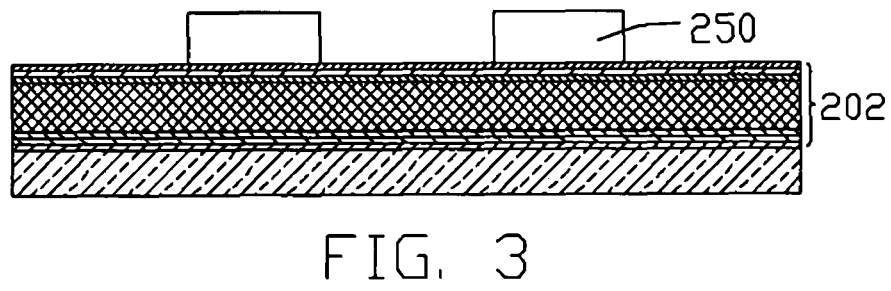

Referring to FIG. 3, a photo mask (not shown) having a predetermined pattern and a UV light beam (not shown) are provided. The photo-resist layer is exposed to the UV light beam through the photo mask. The exposed photo-resist layer is then developed to form a photo-resist layer pattern 250.

Figure 4:
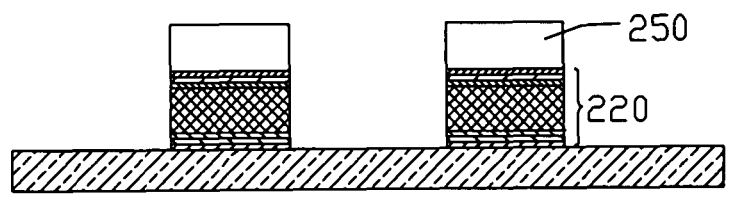
Figure 5:
Figure 6:
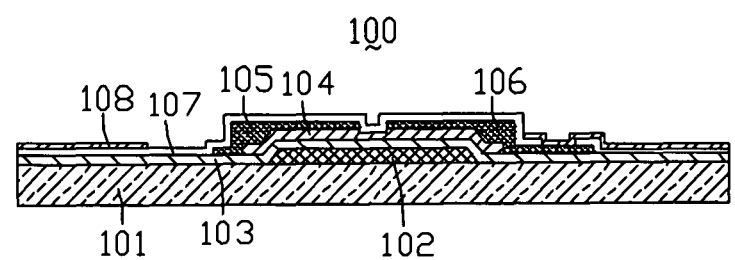
FIG. 6 is a side, cross-sectional view of part of a first conventional thin film transistor array substrate, showing one gate electrode.
Figure 7:
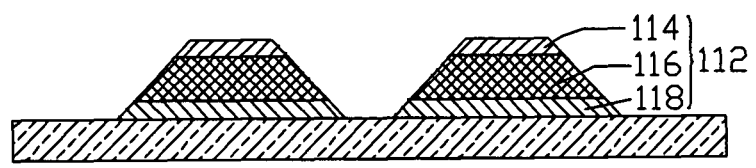
FIG. 7 is a side, cross-sectional view of part of a second conventional thin film transistor array substrate, showing two gate electrodes having sandwich structures.
Figure 8:
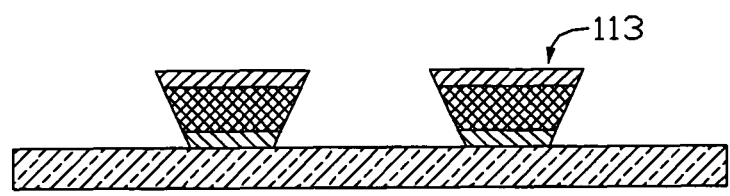
FIG. 8 is a side, cross-sectional view of part of a third conventional thin film transistor array substrate, showing two gate electrodes having sandwich structures.

Referring to FIG. 4, the gate electrode layer 202 is etched so as to remove a part of the gate electrode layer 202 that is not covered by the photo-resist layer pattern 250. Referring also to FIG. 5, the residual photo-resist layer pattern 250 is removed to form a plurality of gate electrodes 220. Then, an insulating layer 230 (see FIG. 1) is formed on the substrate 210 having the gate electrodes 220.

Unlike in conventional gate electrodes, the barrier layer 222 and the adhesive layer 226 both have sandwich structures. The barrier layer 222 includes the second copper layer 223, and the adhesive layer 226 includes the first copper layer 227. Thus, differences in etching speeds among the barrier layer 222, the copper conductive layer 224, and the adhesive layer 226 are moderated. Preferably, the etching speeds of the barrier layer 222, the conductive layer 224, and the adhesive layer 226 are approximately the same. In such case, the barrier layer 222, the conductive layer 224, and the adhesive layer 226 can be etched substantially uniformly. Thereby, a width of the gate electrode 220 can be substantially uniform from the top of the gate electrode 220 to the bottom of the gate electrode 220. That is, formation of the gate electrode 220 whereby the gate electrode 220 has a trapezium structure is avoided. Accordingly, problems such as short circuits or open circuits can be avoided or even eliminated altogether.

It is to be understood, however, that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A thin film transistor (TFT) array substrate, comprising:
   a transparent substrate; and
   a gate electrode formed on the substrate, the gate electrode comprising an adhesive layer formed on the substrate, a conductive layer formed on the adhesive layer, and a barrier layer formed on the conductive layer, each of the adhesive layer and the barrier layer having a sandwich structure, wherein a central core of the adhesive layer, the conductive layer, and a central core of the barrier layer are made of a same material.

2. The thin film transistor array substrate as claimed in claim 1, wherein said same material comprises copper.

3. The thin film transistor array substrate as claimed in claim 2, wherein a thickness of the conductive layer is in the range from approximately 200 to approximately 400 nm.

4. The thin film transistor array substrate as claimed in claim 1, wherein the adhesive layer comprises a first adhesive metal layer, a second adhesive metal layer, and a copper layer sandwiched between the first adhesive metal layer and the second adhesive metal layer.

5. The thin film transistor array substrate as claimed in claim 4, wherein a thickness of the adhesive layer is in the range from approximately 5 to approximately 30 nm.

6. The thin film transistor array substrate as claimed in claim 4, wherein the first adhesive metal layer and the second adhesive metal layer are made from a same material.

7. The thin film transistor array substrate as claimed in claim 6, wherein the first adhesive metal layer and the second adhesive metal layer are made from material including at least one item selected from the group consisting of titanium, molybdenum, chromium, tungsten, and an alloy of copper and molybdenum.

8. The thin film transistor array substrate as claimed in claim 1, wherein the barrier layer comprises a first barrier metal layer, a second barrier metal layer, and a copper layer sandwiched between the first barrier metal layer and the second barrier metal layer.

9. The thin film transistor array substrate as claimed in claim 8, wherein a thickness of the barrier layer is in the range from approximately 5 to approximately 30 nm.

10. The thin film transistor array substrate as claimed in claim 8, wherein the first barrier metal layer and the second barrier metal layer are made from a same material.

11. The thin film transistor array substrate as claimed in claim 10, wherein the first barrier metal layer and the second barrier metal layer are made from at least one item selected from the group consisting of titanium nitride (TiN) and tantalum nitride (TaN).

12. The thin film transistor array substrate as claimed in claim 1, further comprising an insulating layer formed on the substrate and the gate electrode.

13. The thin film transistor array substrate as claimed in claim 1, wherein the substrate is made from one of glass and quartz.

14. The thin film transistor array substrate as claimed in claim 1, wherein a thickness of the barrier layer is equal to a thickness of the adhesive layer.

15. A thin film transistor array substrate, comprising:
a transparent substrate; and
a gate electrode formed on the substrate, the gate electrode comprising an adhesive layer formed on the substrate, a conductive layer formed on the adhesive layer, and a barrier layer formed on the conductive layer, the adhesive layer comprising a first adhesive metal layer, a second adhesive metal layer, and a first core layer sandwiched between the first adhesive metal layer and the second adhesive metal layer, the barrier layer comprising a first barrier metal layer, a second barrier metal layer, and a second core layer sandwiched between the first barrier metal layer and the second barrier metal layer, wherein the first core layer, the conductive layer, and the second core layer comprise a same material.

16. The thin film transistor array substrate as claimed in claim 15, wherein the first core layer, the second core layer and the conductive layer comprise copper.

17. The thin film transistor array substrate as claimed in claim 15, wherein the first adhesive metal layer and the second adhesive metal layer are made from material including at least one item selected from the group consisting of titanium, molybdenum, chromium, tungsten, and an alloy of copper and molybdenum.

18. The thin film transistor array substrate as claimed in claim 15, wherein the first barrier metal layer and the second barrier metal layer are made from at least one item selected from the group consisting of titanium nitride (TiN) and tantalum nitride (TaN).

19. The thin film transistor array substrate as claimed in claim 15, wherein a thickness of the barrier layer is in the range from approximately 5 to approximately 30 nm.

20. A method of manufacturing a thin film transistor array substrate, the method comprising:
providing a substrate;
forming a first adhesive metal layer on the substrate;
forming a first core layer on the first adhesive metal layer;
forming a second adhesive metal layer on the first core layer;
forming a conductive layer on the second adhesive metal layer;
forming a first barrier metal layer on the conductive layer;
forming a second core layer on the first barrier metal layer; and
forming a second barrier metal layer on the second core layer;
wherein the first core layer, the conductive layer and the second core layer comprise a same material.

* * * * *